DIGITAL ENCODER

Filed Feb. 6, 1963 3 Sheets-Sheet 1

INVENTORS
WILLIAM H. SAYLOR
ALAN STEWART
BY
Shenier & O'Connor
ATTORNEYS

INVENTORS
WILLIAM H. SAYLOR
ALAN STEWART
BY
Shenier & O'Connor
ATTORNEYS

April 12, 1966 W. H. SAYLOR ETAL 3,246,316

DIGITAL ENCODER

Filed Feb. 6, 1963 3 Sheets-Sheet 3

INVENTORS
WILLIAM H. SAYLOR
ALAN STEWART
BY
Shenier & O'Connor
ATTORNEYS 3,246,316
DIGITAL ENCODER William H. Saylor, Corona Del Mar, and Alan Stewart, Santa Ana, Calif., assignors to United Aircraft Corporation, East Hartford, Conn., a corporation of Delaware Filed Feb. 6, 1963, Ser. No. 256,620
10 Claims. (Cl. 340—347)

Our invention relates to a digital encoder and more particularly to an encoder for producing directly an unambiguous decimal digital output representation of the position of a shaft or the like.

There are known in the prior art various forms of analog to digital converters. In most of these encoders of the prior art a shaft carrying disks having coded patterns thereon rotates the disks with respect to stationary brushes to produce an output representation of shaft position in some binary code. The most common converter produces the output in the natural binary code. While a converter of this type is satisfactory for applications in which the converter output is fed to a computer or the like there are other instances in which it is not suitable for use by itself as the encoding device. For example, in many machine tool applications it is desirable that the indication of the shaft position or the like be provided in a decimal form. In order to accomplish this result when using a binary coded converter of the type known in the prior art it is necessary to use auxiliary conversion equipment to give the desired decimal read-out.

We have invented an analog to digital converter which directly generates an output representation in the decimal system. Our converter is especially adapted for use in machine tool control systems. In such applications it requires no auxiliary conversion equipment to produce the desired output representation. We accomplish this result while avoiding the possibility of ambiguities as the converter moves from one position to the next. The resolution provided by our converter is substantially increased over that of many converters of the prior art. Our converter may be arranged to provide a binary coded decimal output in an extremely simple manner.

One object of our invention is to provide an analog to digital converter which directly produces a decimal output representation of shaft position or the like.

Another object of our invention is to provide an analog to digital converter which is especially suited for use in machine tool control systems.

A further object of our invention is to provide an encoder for generating a decimal representation of shaft position without ambiguity.

Still another object of our invention is to provide an analog to digital converter for producing a decimal output representation without the use of auxiliary equipment.

Other and further objects of our invention will appear from the following description:

In general our invention contemplates the provision of an analog to decimal digit converter in which rotating brushes contact a stationary coded conductive pattern to produce a decimal output indication of shaft position. Clock pulses generated by one digit section of our converter so control the operation of the next more significant digit section that ambiguities in the output are prevented even when a brush bridges a pair of adjacent read-out segments.

In the accompanying drawings which form part of the instant specification and which are to be read in conjunction therewith and in which like reference numerals are used to indicate like parts in the various views.

Figure 1:
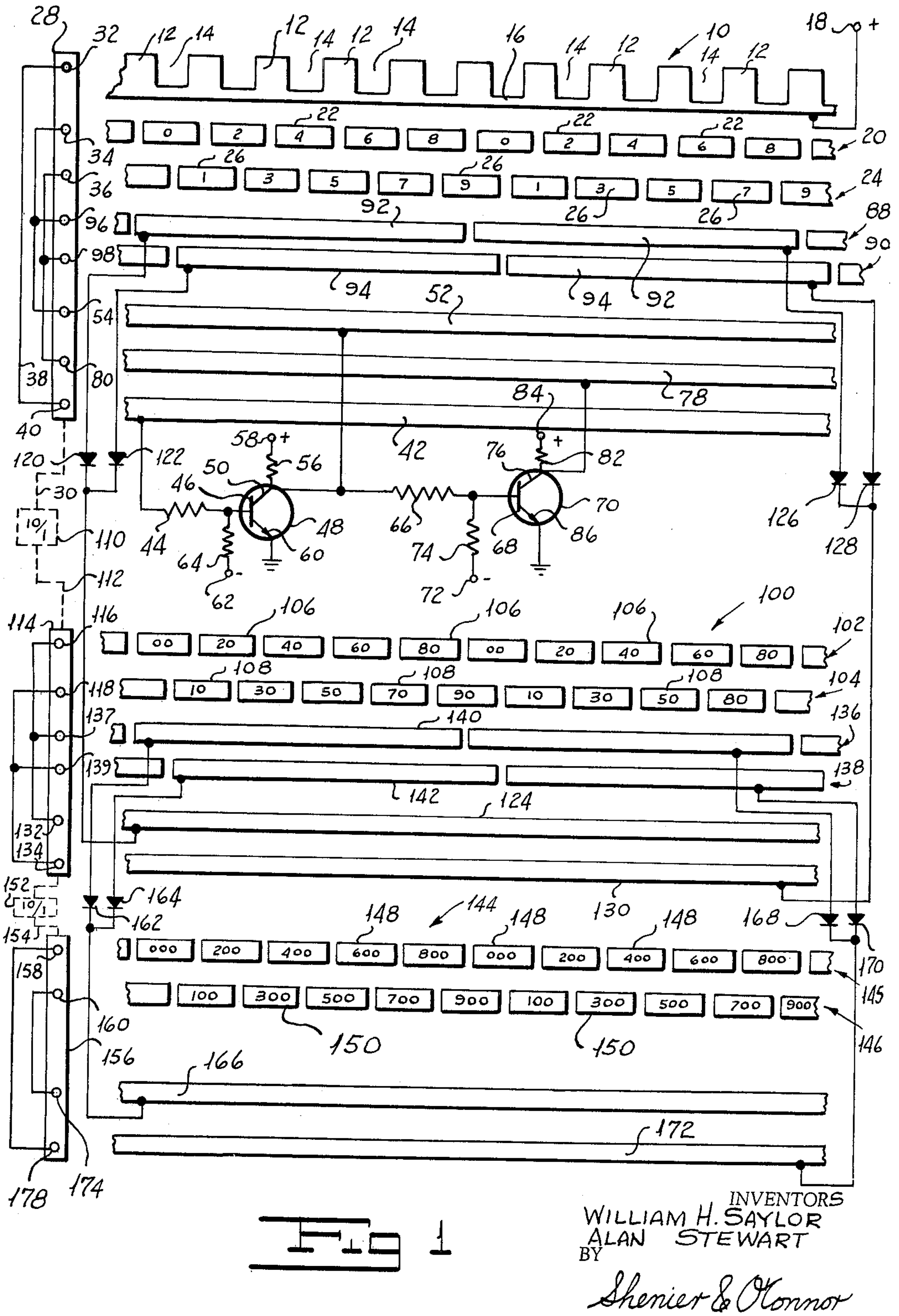
FIGURE 1 is a schematic view of one form of our analog to decimal digit converter.

Referring now to FIGURE 1 of the drawings the least significant digit section indicated generally by the reference character 10 of our converter includes a row of clock-pulse generating segments 12 adjacent ones of which are separated by nonconductive spaces 14. A conductor 16 connects all the segments 12 to apply a suitable potential from a source terminal 18 to the segments 12. The section 10 has a row indicated generally by the reference character 20 of even digit output information segments 22 and a row indicated generally by the reference character 24 of odd digit output information segments 26. In the particular form of our converter shown in FIGURE 1 we provide ten segments 22 and ten segments 26 with the segments 22 bridging the nonconductive spaces 14 of the clock pulse row and with the segments 26 bridging the segments 12 of the clock pulse row. As will be explained more fully hereinafter adjacent segments 22 and adjacent segments 26 need only be separated by a relatively narrow nonconductive or insulating space. It will readily be understood that the row of segments 12 as well as the rows 20 and 24 are carried by a suitable support (not shown). Further, individual output leads (not shown) are provided for each of the segments 22 and 26. For purposes of clarity we have omitted these parts in the showing of FIGURE 1.

The section 10 of the form of our converter shown in FIGURE 1 includes a brush-holder 28 driven by a suitable mechanism such as a shaft 30 to move the holder over the rows of segments 12, 22 and 26. Holder 28 carries respective brushes 32, 34 and 36 which correspond to the respective rows of segments 12, 22 and 26. A conductor 38 connects the brush 32 to a brush 40 adapted to engage a slip ring 42. A resistor 44 connects the base 46 of an n-p-n transistor 48 to the slip ring 42. We connect the collector 50 of transistor 48 to a slip ring 52 adapted to be engaged by a brush 54 on the holder 28. A resistor 56 applies a positive potential at a terminal 58 to the collector 50. We connect the emitter 60 of transistor 48 to ground and apply a negative bias from a terminal 62 through a resistor 64 to the base 46. A resistor 66 couples the collector 50 of transistor 48 to the base 68 of a transistor 70 to which a base bias voltage at a terminal 72 is applied by a resistor 74. We connect the collector 76 of transistor 70 to a slip ring 78 adapted to be engaged by a brush 80 on the holder 28. A resistor 82 connects collector 76 to the terminal 84 of a suitable source of positive potential. We connect the emitter 86 of transistor 70 to ground.

From the structure just described it will be apparent that with the brush 32 aligned with a nonconductive space 14 no potential is applied to the ring 42 by the brush 40. Under these conditions the base 46 of transistor 48 is biased negative and the positive potential at terminal 58 is applied to the ring 52. In this position of the brush holder with respect to the segments, the brush 34 engages the central portion of one of the segments 22 so that the potential at ring 52 is coupled to the segment 22 engaged by the brush 34. At the same time the base 68 of transistor 70 is biased positive with the result that the transistor conducts so that the collector 76 is substantially at ground potential. Thus the ring 78 which corresponds to odd digits is in ground potential.

Now when the holder 28 moves to a position at which the brush 32 engages a segment 12 then the positive potential at terminal 18 is applied to the brush and, through conductor 38 and brush 40, is applied to the ring 42. This application of positive potential to the ring 42 overcomes the negative bias at terminal 62 to cause transistor 48 to conduct to bring its collector 50 down to ground potential. Thus the ring 52 is at ground potential. Moreover, owing to the fact that the collector 50 is now at ground the negative bias at terminal 72 takes over and extinguishes conduction in transistor 70 so that the positive potential at terminal 84 is coupled to the ring 78. Brush 80 conducts the potential on the ring 78 to the odd segment 26 which is now contacted by brush 36.

From the arrangement just described it will be clear that in any position of holder 28 at which brush 32 is aligned with a nonconductive space transistor 48 is off and transistor 70 is on. Thus a positive potential is applied to the segment 22 contacted by brush 34 and no potential is applied to any of the segments 26.

We provide section 10 of our converter with two rows indicated generally by reference characters 88 and 90 for generating clock pulses for the section to be described hereinafter corresponding to the next to most significant digit. The row 88 includes two segments 92 while the row 90 includes two segments 94. A brush 96 connected to the brush 54 which engages ring 52 contacts the segments 92 of row 88 while a brush 98 connected to the brush 80 which engages ring 78 contacts the segments 94 as the brush-holder 28 moves with respect to the segments. It will be apparent that as the brush 32 alternately contacts a segment 12 and a nonconductive space 14 the segments 92 and 94 alternately receive clock pulses. We employ the pulses on the segments 92 and 94 to the left as viewed in FIGURE 1 to provide even digit clock pulses for the next succeeding section of our converter in a manner to be described hereinafter. Similarly we use the pulses applied to the two segments 92 and 94 at the right in FIGURE 1 to provide odd clocking pulses to the next succeeding section.

The next-to-least significant digit section indicated generally by the reference character 100 of the form of our converter shown in FIGURE 1 includes respective rows indicated generally by the reference characters 102 and 104 of information segments 106 and 108. A suitable gear reduction mechanism 110 couples the shaft 30 to the shaft 112 of a brush-holder 114 which supports respective brushes 116 and 118 adapted to ride over the rows of segments 106 and 108. A pair of diodes 120 and 122 connect the segments 92 and 94 to the left in FIGURE 1 to an even clock pulse slip ring 124 of the section 100. Respective diodes 126 and 128 couple the segments 92 and 94 to the right in FIGURE 1 to an odd clock pulse slip ring 130. Respective brushes 132 and 134 are adapted to apply pulses from the rings 124 and 130 respectively to the row 102 of segments 106 and to the row 104 of segments 108 through brushes 116 and 118. We provide the mechanism 110 to give a speed reduction of from 10 to 1 in going from the least significant digit section 10 to the next-to-least significant digit section 100 of our converter.

With the brush 116 in engagement with one of the even digit segments 106 pulses applied to the segments 92 and 94 to the left as viewed in FIGURE 1 will be coupled to the segment 106 through the ring 124, brush 132 and brush 116 to the segment. By the time the holder 114 reaches a point at which a signal should be applied to the odd segment 108 contacted by brush 118 and as brush 116 is approaching the end of the segment 106 it contacts, then the carrier 28 is in a position at which it is moving into engagement with the two segments 92 and 94 to the right as viewed in FIGURE 1. At this time pulses applied to the segments 92 and 94 are coupled by diodes 126 and 128 to the odd clock pulse ring 130 and from this ring through brushes 134 and 118 to the odd segment 108 being engaged by the brush. From the arrangement thus far described it will be apparent that potential is applied to any segment 22, 26, 106 and 108 only over the central portion of the segment. For this reason the accuracy of the output of our converter is not affected by the bridging of a pair of adjacent segments by any brush. Owing to this fact the segments may be made relatively wide and the intersegmental insulation need not be accurately controlled. Further, since we provide an information segment for each segment 12 and for each segment 14 of the clock pulse row our converter has a relatively high resolution.

We provide the section 100 with two rows indicated generally by the reference characters 136 and 138 of clock pulse segments 140 and 142. Each row has two segments. Respective brushes 137 and 139 couple the signals from rings 124 and 130 to the respective rows 136 and 138 of segments 140 and 142. The two segments 140 and 142 to the left as viewed in FIGURE 1 provide even clock pulses for the next section indicated generally by the reference character 144 of the form of our converter shown in FIGURE 1 while the two segments 140 and 142 to the right as viewed in FIGURE 1 provide the odd clock pulses for the section 144.

Section 144 includes respective rows indicated generally by the reference characters 145 and 146 of odd digit information segments 148 and even digit information segments 150. A gear reduction mechanism 152 providing, for example, a step-down of from 10 to 1 connects the shaft 112 of the holder 114 to a shaft 154 of a brush-holder 156 having respective brushes 158 and 160 adapted to contact the segments of the rows 145 or 146. Diodes 162 and 164 connect the segments 140 and 142 to the left as viewed in FIGURE 1 to the even clock pulse slip ring 166 of section 144 while diodes 168 and 170 connect segments 140 and 142 to the right as viewed in FIGURE 1 to the odd clock pulse slip ring 172 of the section 144. Respective brushes 174 and 178 engage rings 166 and 172 to conduct the pulses on slip rings 166 and 172 to the brushes 158 and 160 adapted to engage segments 148 and 150. The operation of the most significant digit section 144 of the form of our converter shown in FIGURE 1 will readily be apparent from the explanation of the operation of section 100.

Figure 2:
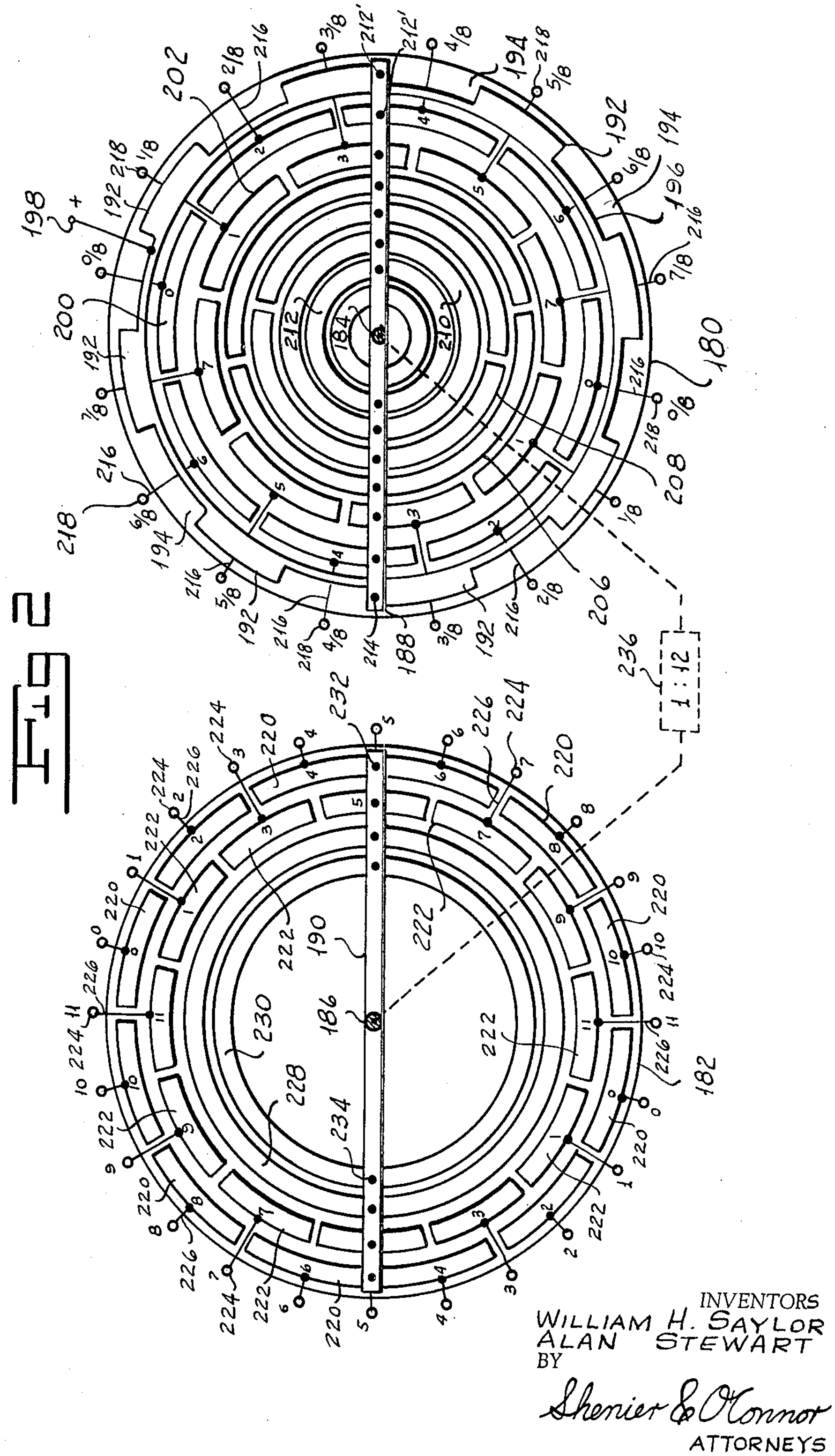
FIGURE 2 is a schematic view illustrating another form of our analog to decimal digit converter.

Referring now to FIGURE 2 of the drawings we have shown a modified form of our analog to decimal digital converter in which respective supports 180 and 182 carry a lesser significant digit section and a more significant digit section. Respective shafts 184 and 186 carry brush-holders 188 and 190 associated with the supports 180 and 182. Section 180 carries a ring of clock pulse segments 192 separated by nonconductive spaces 194 and connected by a ring 196 to which we apply potential from a terminal 198. This form of our converter includes a ring of even information segments 200 and a ring of odd information segments 202. Rings of respective clock pulse segments 206 and 208 provide clock pulses for the section of the converter carried by support 182. Slip rings 210 and 212 are provided for coupling the pulses generated by the segments 192 and the associated flip-flop circuitry (not shown) to the rings of information segments 200 and 202. Brush-holder 188 carries a first set of brushes 212' so located as to engage the respective rows of segments and the slip rings as shaft 184 rotates. Preferably we provide the brush-holder 188 with a second set of diametrically oppositely located brushes 214 for contacting the respective rings. The advantage of this arrangement is that two independent outputs are derived. These two outputs may be paralleled if desired to increase the certainty of operation of our converter. Respective conductors 216 are adapted to carry the outputs from the various information segments 200 and 202 to terminals 218. These conductors 216 may, if desired, be brought out from the back of the device. For purposes of clarity we have shown them on the face of the support 18 so far as is possible. It will readily be appreciated that interconnections between the brushes are provided in the manner illustrated in the form of our converter shown in FIGURE 1.

The section of the converter carried by support 182 includes rows of information segments 220 and 222 the outputs of which are carried to terminals 224 by conductors 226. Respective slip rings 228 and 230 receive the clock pulses from the preceding section of the converter on support 180. We provide the support 190 with respective sets of brushes 232 and 234 adapted to engage the rows of segments and the slip rings on the support 182.

We have arranged the form of our converter shown in FIGURE 2 to give a digital indication of inches and eighths of an inch respectively. For this reason the least significant digit section of the converter includes two sets of eight segments 200 and eight segments 202 respectively on the support 180. Each segment of this section of our converter corresponds to one eighth of an inch. The higher order section of this form of our converter includes two sets of segments 220 and segments 222 with each set having twelve segments. It will be apparent that one revolution of the shaft 186 corresponds to one foot. In order to ensure the proper output representation we connect the shaft 184 to the shaft 186 by a gear reduction mechanism 236 providing a 12 to 1 step-down.

Figures 3, 4:
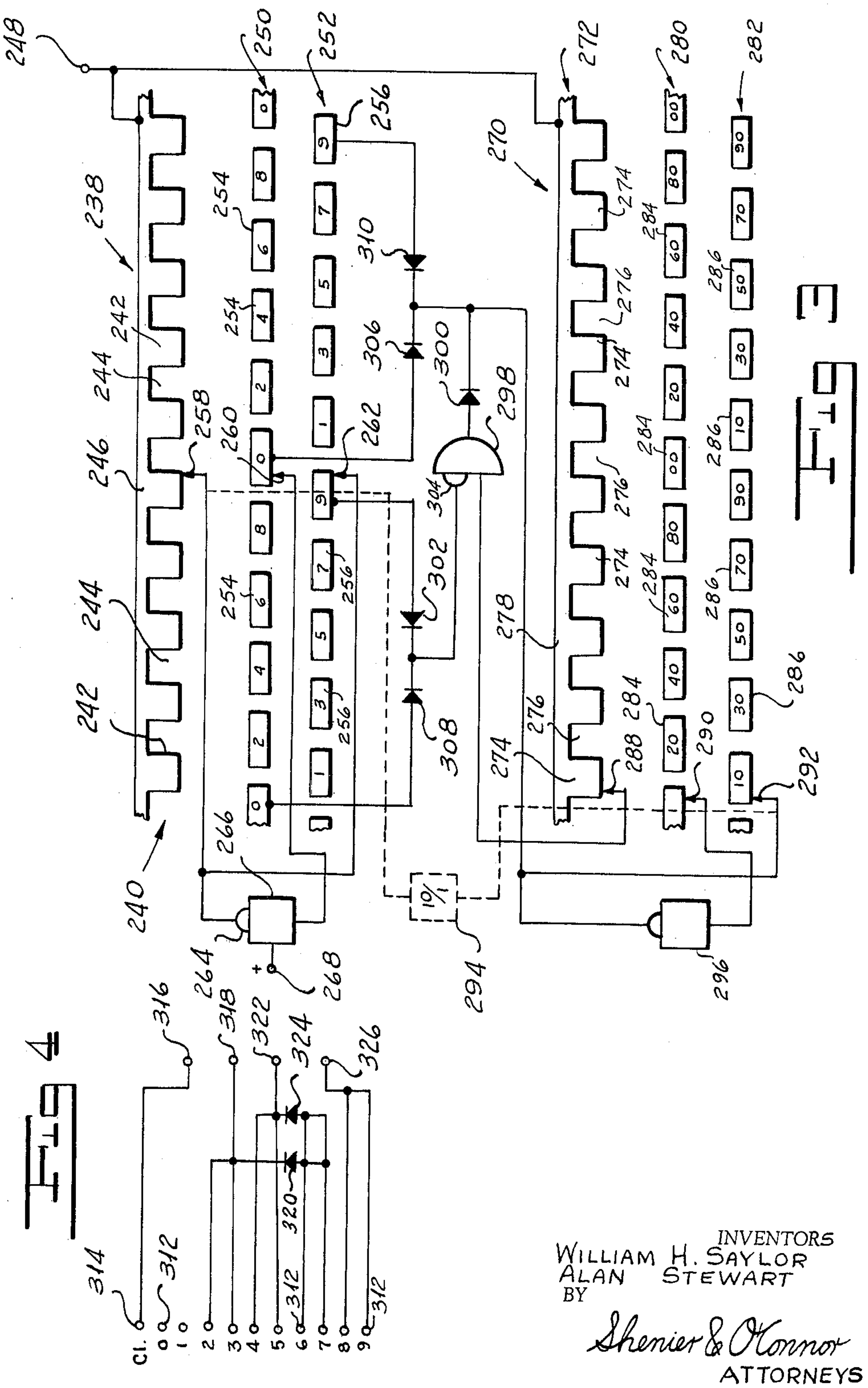
FIGURE 3 is a schematic view of a further form of our analog to decimal digit converter.
FIGURE 4 is a schematic view indicating a means for producing a binary coded decimal read-out in our converter.

While the form of our converter illustrated in FIGURE 1 functions satisfactorily it requires a high frequency switching between the brushes 132 and 134 which apply the clock pulses to the information segments of the second or intermediate significance digit section 100 of the converter. Referring now to FIGURE 3 we have shown a modified form of converter in which this high frequency switching is avoided while at the same time obviating the possibility of the occurrence of an output ambiguity. As will be apparent from the description given hereinafter the code pattern of this form of our converter is somewhat simpler than that of the form shown in FIGURE 1. In the least significant digit or high speed section indicated generally by the reference character 238 of this form of our converter a clocking pulse generator row indicated generally by the reference character 240 has a plurality of conductive segments 242 separated by nonconductive spaces 244 and connected by a ring 246 to the terminal 248 of a suitable source of positive potential. Section 238 includes respective rows 250 and 252 of even information segments 254 and odd information segments 256. Respective brushes 258, 260 and 262 are adapted to be driven along the segments of the respective rows 240, 250 and 252. We connect brush 258 directly to the brush 262 and to inhibiting input terminal 264 of a circuit 266 which normally passes potential from a terminal 268 to the brush 260.

From the description given thus far it will be clear that when the brush 258 engages a segment 242 potential is applied to brush 262. The segments 256 are centered with respect to the segments 242 and overlap these segments so that with brush 258 in engagement with a segment 242 a segment 256 carries an output indicating an odd least significant digit. It will be appreciated that when brush 258 engages a segment circuit 266 is inhibited by the presence of an input at terminal 264.

When brush 258 is aligned with a nonconductive space 244 no signal is applied to brush 262 and no segment 266 carries an output. However, at this time since no inhibiting input appears at terminal 264 the circuit 266 applies a potential to the brush 260 which in this position of brush 258 engages a segment 254 to cause the engaged segment to indicate an even least significant digit. The section indicated generally by the reference character 270 of our conveyor corresponding to the next more significant digit has a row indicated generally by the reference character 272 of clock pulse generating segments 274 separated by nonconductive spaces 276 and connected by a ring 278 to terminal 248.

Section 270 includes respective rows 280 and 282 of even digit segments 284 and odd digit segments 286. Respective brushes 288, 290 and 292 of section 270 are adapted to contact the rows of segments 274, 284 and 286. A gear reduction system indicated schematically at 294 provides a 10 to 1 speed reduction from brushes 258, 260 and 262 to brushes 288, 290 and 292. It will readily be apparent that the clock pulses of the section 270 could be applied directly to the brush 290 and to brush 292 through suitable logic circuitry 296 directly to control the outputs of segments 284 and 286. If this were done, however, possible ambiguities would exist.

This fact can best be explained by considering a specific example. Let us assume that the brushes 260 and 262 are in a position at which the output of section 238 of the converter is changing from 9 to 0 and that brushes 290 and 292 are in a position at which the output of section 270 is to change from 0 to 1. It may be that brush 288 will contact the segment 274 before the output of section 238 has changed from 9 to 0. If this occurs then the converter will produce an erroneous output of 19 instead of the correct output 10. On the other hand if the brush 288 does not contact the segment 274 until after the output of section 238 has changed from 9 to 0 then the converter will produce an erroneous output indication of 00 rather than the correct output 10. We have arranged the form of our converter shown in FIGURE 3 to prevent this occurrence. We connect the brush 288 to a gating circuit 298 which normally passes the signal on brush 288 to a diode 300 which couples the signal directly to brush 292 and to the circuit 296 to ensure that while brush 292 carries a signal brush 290 carries no signal. A diode 302 connected directly to the output lead from the first "9" segment of row 252 applies any output appearing at this segment to an inhibiting input terminal 304 of circuit 298. Thus, considering the situation in which the first "9" segment of row 252 still carries a signal so that the output of section 238 has not yet changed from 9 to 0 and assuming that brush 288 has already engaged the segment 274 so as to apply a signal to circuit 298 this signal will not be coupled by circuit 298 to brush 292 owing to the presence of an inhibiting signal applied to terminal 304 by the diode 302. The output of section 270 cannot change from 0 to 1 until the output of section 238 changes from 9 to 0.

A diode 306 applies any output signal appearing on the "0" segment 254 adjacent the first "9" segment 256 of row 252 directly to brush 292 and to the circuit 296. Thus if the output of section 238 has changed from 9 to 0 but, for some reason, brush 288 has not yet contacted segment 274 nevertheless a signal is applied to brush 292 to cause the output of section 270 to change from 0 to 1 to avoid the possibility of an ambiguous output.

Respective diodes 308 and 310 connect the outputs of the other "0" segment 254 and the other "9" segment 256 respectively to terminal 304 and to brush 292 and circuit 296 to prevent similar ambiguities at other positions of the brushes. In this manner we control the transfer from one segment to the next in the next-to-least significant section by using the outputs of the least significant section.

Referring now to FIGURE 4 we have shown an extremely simple means for causing our converter to produce a binary coded decimal output representation. We have indicated the information output terminals associated with respective decimal digit output signals of the converter by the reference character 312. In addition we have shown a terminal 314 which carries the clocking pulse of any section. We connect the clocking pulse terminal directly to a terminal 316 which carries the least significant bit of the binary coded decimal output representation. We have indicated the digits to which the terminals 312 correspond to the left of these terminals in FIGURE 4. We connect the terminals 312 corresponding to the digits 2 and 3 directly to the next-to-least significant bit terminal 318 of the output binary coded decimal representation. A diode 320 connects the terminals 312 corresponding to the digits 6 and 7 to the terminal 318. We apply the output corresponding to the digit 4 directly to the next-to-most significant bit output terminal 322 of the binary coded decimal representation. A diode 324 couples the output terminals 312 corresponding to digits 6 and 7 to the terminal 322. We connect the output terminals 312 corresponding to digits 8 and 9 directly to the most significant bit output terminal 326 of the binary coded decimal output representation. This arrangement causes our converter to generate a binary coded decimal output by using only two additional diodes 320 and 324 over those already present in the system.

In operation of the form of our converter shown in FIGURE 1 the brush-holders 28, 114 and 156 are driven with 10 to 1 gear reductions from the holder 28 to the holder 114 and from the holder 114 to the holder 156. With the brush 32 in engagement with a segment 12 a clock pulse is applied to ring 78 and is coupled by brushes 80 and 36 to the odd digit information segments 26 of the row 24. With the brush 32 over a nonconductive space 14 an even clock pulse is applied to ring 52 and is coupled by brushes 54 and 34 to the even digit information segment 22 of the row 20. The arrangement is such that signals are applied to the segments 22 and 26 only over the central portions thereof to avoid the possibility of ambiguities at transfer points. That is, the output of the converters is not affected by the fact that a brush may bridge two adjacent information segments. The arrangement of the form of our converter shown in FIGURE 1 is such that only one of the segments 22 or 26 carries an output representing one decimal digit at any one time.

The clock pulses for the section 10 are applied to the segments 92 and 94 by brushes 96 and 98 to generate clock pulses for the section 100 of our converter. The arrangement is such that the two segments 92 and 94 to the left as viewed in FIGURE 1 provide even clock pulses for ring 124 while the two segments 92 and 94 to the right as viewed in FIGURE 1 provide odd clock pulses which are applied to the ring 130. The section 100 of our converter generates the next-to-least significant output digit as well as clock pulses for the most significant digit section 144. It will be apparent that the form of our converter shown in FIGURE 1 is capable of generating output representations from 000 to 999.

While we have shown only a three digit output converter it will be clear that we may provide as many sections and output digits as are practicable. Each section generates clock pulses which control the operation of the succeeding section to avoid output ambiguities.

The operation of the form of our converter illustrated in FIGURE 2 is similar to that shown in FIGURE 1 with the exception that the section carried by support 182 provides an output in inches while the section carried by support 180 provides an output in eighths of inches. In addition in FIGURE 2 we have shown a form of the converter which has two sets of diametrically oppositely positioned brushes to provide outputs which can be paralleled to provide more certainty in the output.

The operation of the form of our converter shown in FIGURE 3 will readily be apparent from the description given hereinabove. In this converter switching digits following the next-to-least significant digit are controlled by the output of the digit section of next lesser significance to avoid the possibility of ambiguous output signals.

It will be seen that we have accomplished the objects of our invention. We have provided a digital encoder which directly produces a decimal output indication.

Our converter is especially adapted for use in machine tool control systems. It generates a decimal ouput while minimizing the possibility of an ambiguous output reading. The resolution provided by our converter is substantially increased over that which is possible with many converters of the prior art. We may readily arrange our converter to provide a binary coded decimal output.

It will be understood that certain features and subcombinations are of utility and may be employed without reference to other features and subcombinations. This is contempulated by and is within the scope of our claims. It is further obvious that various changes may be made in details within the scope of our claims without departing from the spirit of our invention. It is, therefore, to be understood that our invention is not to be limited to the specific details shown and described.

Having thus described our invention, what we claim is:

1. A device for converting mechanical motion into a digital representation of such motion in a number system having a base *b* of at least three including in combination a first member having a surface, a first row of conductive elements mounted on the first member, the first row comprising alternating conductive elements and non-conductive inter-element spaces, each element subtending one digital count, each space subtending one digital count, the combined number of elements and spaces being *b*, a second and a third row of conductive elements mounted on the first member, each element of the second row corresponding to an element of the first row, each element of the third row corresponding to a space of the first row, said first member comprising insulating means surrounding each segment of the second and third rows at said surface, said insulating means including insulating spaces between adjacent segments of a row at said surface, said spaces subtending a fractional part of a count, and an insulating space between said rows at said surface, a second member mounted for movement relative to the first member, a source of voltage, means coupling the source to the first row, means mounted in part on the second member for obtaining from the first row two outputs complementary to one another, means mounted in part on the second member for coupling only one of the outputs to the second row, means mounted in part on the second member for coupling the other output to the third row, and means comprising the second and third rows for providing the output digits: 0,1 . . . $(b-1)$.

2. A device for converting mechanical rotation into a digital representation of such rotation in a number system having a base *b* of at least three including in combination a first member having a surface, a first circle of conductive segments mounted on the first member, the first circle comprising alternating conductive segments and non-conductive intersegmental spaces, each segment subtending one digital count, each space subtending one digital count, the combined number of segments and spaces being $2kb$ where *k* is an integer, a second and a third circle of conductive segments mounted on the first member, each segment of the second circle corresponding to a segment of the first circle, each segment of the third circle corresponding to a space of the first circle, said first member comprising insulating means surrounding each segment of the second and third rows at said surface, said insulating means including insulating spaces between adjacent segments of a row at said surface, said spaces subtending a fractional part of a count, and an insulating space between said rows at said surface, a second member mounted for rotation relative to the first member, a source of voltage, means coupling the source to the first circle, means mounted in part on the second member for obtaining from the first circle two outputs complementary to one another, means mounted in part on the second member for coupling only one of the outputs to the second circle, means mounted in part on the second member for coupling the other output to the third circle, and means comprising the segments of the second and third circles for providing the output digits: 0,1 . . . ($b$–1); . . . 0,1 . . . ($b$–1).

3. A device as in claim 2 including means responsive to said two complementary outputs for providing a bi-polar signal which reverses polarity only when an output digit changes from ($b$–1) to 0 or from 0 to ($b$–1).

4. A device as in claim 2 in which $k$ is at least two, said device including a fourth and a fifth row each having $k$ conductive segments mounted on the first member, said first member comprising insulating means surrounding each segment of the fourth and fifth rows at said surface, said insulating means including insulating spaces between adjacent segments of each of said fourth and fifth rows at said surface, and an insulating space between said fourth and fifth rows at said surface, means responsive to said two complementary outputs for providing two signals of opposite polarity each of which reverse in polarity only when an output digit changes from ($b$–1) to 0 or from 0 to ($b$–1), means coupling only one of said opposite polarity signals to the fourth row, and means coupling the other opposite polarity signal to the fifth row.

5. A device as in claim 2 including a fourth and a fifth row of conductive segments mounted on the first member, each of the fourth and fifth rows having $c$ segments where $c$ is an integer at least equal to two, said first member comprising insulating means surrounding each segment of the fourth and fifth rows at said surface, said insulating means including insulating spaces between adjacent segments of said fourth and fifth rows at said surface, and an insulating space between said fourth and fifth rows at said surface, a third member mounted for rotation relative to the first member, speed reduction means connecting the second and third members such that the rotational speed of the third member is less than that of the second member, the factor of speed reduction being $c$, means responsive to said two complementary outputs for providing two signals of opposite polarity each of which reverse in polarity only when an output digit changes from ($b$–1) to 0 or from 0 to ($b$–1), means mounted in part on the third member for coupling only one of said opposite polarity signals to the fourth row, and means mounted in part on the third member for coupling the opposite polarity signal to the fifth row.

6. An analog-to-digital converter having a digital base $b$ of at least three including in combination, a member providing a surface, a first row of conductive elements carried by said member at said surface and separated by non-conductive inter-element spaces, a second and a third row of conductive elements on said member at said surface, insulating means surrounding each element of the second and third rows at said surface, said insulating means comprising insulating spaces between adjacent segments of each row at said surface and an insulating space between said rows at said surface, means for obtaining from the first row two outputs complementary to one another, means coupling only one of the outputs to the second row, means coupling the other output to the third row, and means responsive to the second and third rows for providing the output digits: 0,1 . . . ($b$–1).

7. An analog-to-digital converter including in combination, a member providing a surface a first circle of conductive segments carried by said member at said surface and separated by non-conductive intersegmental spaces, a second and a third circle of conductive segments, each of the second and third circles having $kb$ segments where $k$ is an integer and $b$ is an integer at least equal to three, insulating means surrounding the segments of said second and third circles at said surface, said insulating means comprising insulating spaces between adjacent segments of said second and third circles at said surface and an insulating space between said second and third circles at said surface, means for obtaining from the first circle two outputs complementary to one another, means coupling only one of the outputs to the second circle, means coupling the other output to the third circle, and means responsive to the second and third circles for providing the output digits: 0,1 . . . ($b$–1); . . . 0,1 . . . ($b$–1).

8. A converter as in claim 7 including means responsive to the two complementary outputs for providing a bi-polar signal which reverses polarity only when an output digit changes from ($b$–1) to 0 or from 0 to ($b$–1).

9. A converter as in claim 7 including a fourth and a fifth circle of conductive segments, insulating means surrounding the segments of each of said fourth and fifth circles at said surface, said insulating means including insulating spaces between adajcent segments of each of said fourth and fifth circles at said surface and an insulating space between said fourth and fifth circles at said surface, means responsive to said two complementary outputs for providing two signals of opposite polarity each of which reverse in polarity only when an output digit changes from ($b$–1) to 0 or from 0 to ($b$–1), means coupling only one of the opposite polarity signals to the fourth circle, and means coupling the other opposite polarity signal to the fifth circle.

10. A converter as in claim 7 including a fourth and a fifth circle of conductive segments, insulating means surrounding each segment of the fourth and fifth circles at said surface, said insulating means including insulating spaces between adjacent segments of the fourth and fifth circles at said surface and an insulating space between the fourth and fifth circles at said surface and each having $c$ segments where $c$ is an integer at least equal to two, a first and a second member each mounted for rotation, said first and said second and said third circles of segments carried by said first member, said fourth and fifth circles carried by said second member speed reduction means connecting the two members such that the rotational speed of the second member is less than that of the first member, the factor of speed reduction being $c$, the complementary output means carried in part by the first member, means responsive to said two complementary outputs for providing two signals of opposite polarity each of which reverse in polarity only when an output digit changes from ($b$–1) to 0 or from 0 to ($b$–1), means carried in part by the second member for coupling only one of said opposite polarity signals to the fourth circle, and means including the second member for coupling said other opposite polarity signal to the fifth circle.

References Cited by the Examiner

UNITED STATES PATENTS

| | | | |
|---|---|---|---|
| 2,809,369 | 10/1957 | Feeney et al. | 340—347 |
| 2,873,441 | 2/1959 | Miller | 340—347 |
| 2,873,442 | 2/1959 | Ziserman | 340—347 |
| 3,070,787 | 12/1962 | Waldron | 340—347 |
| 3,070,789 | 12/1962 | Kristy et al. | 340—347 |

MALCOLM A. MORRISON, *Primary Examiner.*